United States Patent
Platzgummer et al.

(10) Patent No.: US 12,040,157 B2
(45) Date of Patent: Jul. 16, 2024

(54) PATTERN DATA PROCESSING FOR PROGRAMMABLE DIRECT-WRITE APPARATUS

(71) Applicant: IMS Nanofabrication GmbH, Brunn am Gebirge (AT)

(72) Inventors: Elmar Platzgummer, Vienna (AT); Christoph Spengler, Vienna (AT); Michael Haberler, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 87 days.

(21) Appl. No.: 17/664,812

(22) Filed: May 24, 2022

(65) Prior Publication Data
US 2022/0384143 A1 Dec. 1, 2022

(30) Foreign Application Priority Data
May 25, 2021 (EP) .................... 21175588

(51) Int. Cl.
*H01J 37/147* (2006.01)
*H01J 37/30* (2006.01)
(Continued)

(52) U.S. Cl.
CPC ........ *H01J 37/3177* (2013.01); *H01J 37/147* (2013.01); *H01J 37/3007* (2013.01); *H01J 37/3026* (2013.01)

(58) Field of Classification Search
CPC .............. G03F 7/70508; G03F 7/70291; H01J 37/3174
See application file for complete search history.

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| DE | 19634304 A1 | 2/1998 |

(Continued)

OTHER PUBLICATIONS

Extended European Search Report for European Application No. 21175588.9, Search Completed Nov. 8, 2021, Mailed Nov. 16, 2021, 12 Pgs.

(Continued)

*Primary Examiner* — David E Smith
*Assistant Examiner* — Hsien C Tsai

(57) ABSTRACT

In a writing process in a charged-particle multi-beam apparatus, a desired pattern is written onto a target wherein said desired pattern is provided as input pattern data (INPDAT) in a vector format and processed through a pattern data processing flow. A data preprocessing system receives the input pattern data (INPDAT) and preprocesses the input pattern data independently of the writing process, preferably in advance to it, using writing parameter data provided to the data preprocessing system, and writes the intermediate pattern data (IMDAT) thus obtained to a data storage. When a writing process is carried out using the apparatus, its writing control system reads the intermediate pattern data from the data storage, converts them into pattern streaming data (SBUF), and streams the pattern streaming data to the apparatus for writing the pattern to the target.

15 Claims, 10 Drawing Sheets

(51) Int. Cl.
*H01J 37/302* (2006.01)
*H01J 37/317* (2006.01)

(56) References Cited

U.S. PATENT DOCUMENTS

| | | |
|---|---|---|
| 1,903,005 A | 3/1933 | McCuen |
| 2,187,427 A | 1/1940 | Middleton |
| 2,503,173 A | 4/1950 | Reisner |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 4,912,405 A | 3/1990 | Richardson |
| 5,103,101 A | 4/1992 | Berglund et al. |
| 5,189,306 A | 2/1993 | Frei |
| 5,260,579 A | 11/1993 | Yasuda et al. |
| 5,369,282 A | 11/1994 | Arai et al. |
| 5,393,987 A | 2/1995 | Abboud et al. |
| 5,399,872 A | 3/1995 | Yasuda et al. |
| 5,533,170 A | 7/1996 | Teitzel et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,866,300 A | 2/1999 | Satoh et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,107,636 A | 8/2000 | Muraki |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,443,699 B1 | 9/2002 | Mashey |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,067,820 B2 | 6/2006 | Buijsse |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,367,738 B2 | 5/2008 | Cleveland |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,683,551 B2 | 3/2010 | Miyamoto et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,178,856 B2 | 5/2012 | Nakayamada et al. |
| 8,183,543 B2 | 5/2012 | Platzgummer |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 8,736,170 B1 | 5/2014 | Liu et al. |
| 8,859,983 B2 | 10/2014 | Wieland |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,165,745 B2 | 10/2015 | Luo |
| 9,184,026 B2 | 11/2015 | Wieland |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,691,589 B2 | 6/2017 | Van De Peut et al. |
| 9,799,487 B2 | 10/2017 | Platzgummer |
| 9,978,562 B2 | 5/2018 | Van De Peut et al. |
| 10,134,565 B2 | 11/2018 | Matsumoto |
| 10,325,756 B2 | 6/2019 | Platzgummer |
| 10,325,757 B2 | 6/2019 | Platzgummer et al. |
| 10,410,831 B2 | 9/2019 | Platzgummer |
| 10,483,080 B1 | 11/2019 | Cook et al. |
| 10,522,329 B2 | 12/2019 | Platzgummer et al. |
| 10,651,010 B2 | 5/2020 | Platzgummer et al. |
| 10,840,054 B2 | 11/2020 | Platzgummer et al. |
| 11,099,482 B2 | 8/2021 | Hochleitner et al. |
| 11,569,064 B2 | 1/2023 | Platzgummer et al. |
| 11,735,391 B2 | 8/2023 | Gerhold et al. |
| 2001/0028038 A1 | 10/2001 | Hamaguchi et al. |
| 2002/0000524 A1 | 1/2002 | Suzuki et al. |
| 2002/0021426 A1 | 2/2002 | Mei et al. |
| 2002/0036264 A1 | 3/2002 | Nakasuji et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0139054 A1 | 7/2003 | Fujimoto |
| 2003/0155534 A1 | 8/2003 | Platzgummer et al. |
| 2003/0160980 A1 | 8/2003 | Olsson et al. |
| 2004/0056207 A1 | 3/2004 | Petrov et al. |
| 2004/0058536 A1 | 3/2004 | Ki |
| 2004/0119021 A1 | 6/2004 | Parker et al. |
| 2004/0119023 A1 | 6/2004 | Nakasuji et al. |
| 2004/0135102 A1 | 7/2004 | Muraki et al. |
| 2004/0157407 A1 | 8/2004 | Qin-Yi et al. |
| 2004/0169147 A1 | 9/2004 | Ono et al. |
| 2005/0001178 A1 | 1/2005 | Parker et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |

(56) References Cited

U.S. PATENT DOCUMENTS

| | | |
|---|---|---|
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0266413 A1 | 10/2008 | Cohen et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0057571 A1 | 3/2009 | Goto |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0224790 A1 | 9/2010 | Platzgummer et al. |
| 2010/0288938 A1 | 11/2010 | Platzgummer |
| 2011/0049393 A1 | 3/2011 | De Boer et al. |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0091318 A1 | 4/2012 | Wieland et al. |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0286173 A1* | 11/2012 | Van De Peut ...... G03F 7/70508 345/596 |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0061499 A1 | 3/2014 | Ogasawara et al. |
| 2014/0158916 A1 | 6/2014 | Fujimura |
| 2014/0168629 A1 | 6/2014 | Nishida et al. |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264085 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0064180 A1 | 3/2016 | Ren et al. |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0284513 A1 | 9/2016 | Inoue |
| 2016/0336147 A1 | 11/2016 | Platzgummer |
| 2016/0349626 A1 | 12/2016 | Matsumoto |
| 2017/0032926 A1 | 2/2017 | Miyamoto |
| 2017/0154750 A1 | 6/2017 | Sato |
| 2017/0357153 A1 | 12/2017 | Platzgummer |
| 2018/0019094 A1 | 1/2018 | Iwata |
| 2018/0108516 A1 | 4/2018 | Umezawa et al. |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |
| 2019/0214226 A1 | 7/2019 | Platzgummer et al. |
| 2019/0237288 A1 | 8/2019 | Platzgummer et al. |
| 2019/0304749 A1 | 10/2019 | Yoshikawa et al. |
| 2020/0051261 A1 | 2/2020 | Tsuruyama et al. |
| 2020/0312619 A1 | 10/2020 | Mangnus et al. |
| 2020/0348597 A1 | 11/2020 | Hochleitner et al. |
| 2021/0240074 A1 | 8/2021 | Spengler et al. |
| 2021/0335573 A1 | 10/2021 | Gerhold et al. |
| 2023/0015805 A1 | 1/2023 | Spengler et al. |
| 2023/0052445 A1 | 2/2023 | Platzgummer et al. |

FOREIGN PATENT DOCUMENTS

| | | |
|---|---|---|
| EP | 0178156 A2 | 4/1986 |
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| EP | 3070528 A1 | 9/2016 |
| EP | 3460824 A1 | 3/2019 |
| EP | 3460825 A1 | 3/2019 |
| EP | 3518268 A1 | 7/2019 |
| GB | 736995 A | 9/1955 |
| GB | 2349737 A | 11/2000 |
| JP | 4891970 A | 11/1973 |
| JP | 1315934 A | 12/1989 |
| JP | 3155029 A | 7/1991 |
| JP | 3297041 A | 12/1991 |
| JP | 08213301 A | 8/1996 |
| JP | 2004349168 A | 12/2004 |
| JP | 2006019436 A | 1/2006 |
| JP | 2006332289 A | 12/2006 |
| JP | 2007172862 A | 7/2007 |
| JP | 2010098275 A | 4/2010 |
| JP | 2014175104 A | 9/2014 |
| JP | 2015029096 A | 2/2015 |
| JP | 2015162513 A | 9/2015 |
| JP | 2016178300 A | 10/2016 |
| JP | 2017519356 A | 7/2017 |
| WO | 200024030 A2 | 4/2000 |
| WO | 200109922 A1 | 2/2001 |
| WO | 2006084298 A1 | 8/2006 |
| WO | 2008017982 A2 | 2/2008 |
| WO | 2008053140 A1 | 5/2008 |
| WO | 2009147202 A1 | 12/2009 |

(56) References Cited

FOREIGN PATENT DOCUMENTS

| WO | 2012041464 A1 | 4/2012 |
|---|---|---|
| WO | 2012172913 A1 | 12/2012 |

OTHER PUBLICATIONS

"European Search Report for Application No. 08450077.6, Search Completed Jan. 22, 2010", 2 pgs.

"Extended European Search Report for European Application No. 09450211.9, Search Completed Sep. 6, 2010, Mailed Sep. 14, 2010", 4 pgs.

"Extended European Search Report for European Application No. 09450212.7, Search Completed Sep. 13, 2010, Mailed Sep. 28, 2010", 8 pgs.

"Extended European Search Report for European Application No. 10450070.7, Search Completed Apr. 26, 2012, Mailed May 7, 2012", 11 pgs.

"Extended European Search Report for European Application No. 14150119.7, Search Completed Jun. 2, 2014, Mailed Jun. 6, 2014", 8 pgs.

"European Search Report for Application No. 14165967, Search Completed Oct. 30, 2014", 2 pgs.

"European Search Report for Application No. 15164770, Search Completed Sep. 18, 2015", 2 pgs.

"European Search Report for Application No. 14170611, Search Completed Nov. 4, 2014", 3 pgs.

"European Search Report for Application No. 15169632, Search Completed Oct. 20, 2015", 3 pgs.

"European Search Report for Application No. 15164772, Search Completed Sep. 11, 2015", 2 pgs.

"European Search Report for Application No. 14165970, Search Completed Jun. 18, 2014", 2 pgs.

"European Search Report for Application No. 14199183, Search Completed Jun. 19, 2015", 2 pgs.

"European Search Report for Application No. 14176563, Search Completed Jan. 14, 2015", 2 pgs.

"European Search Report for Application No. 15171348, Search Completed Oct. 30, 2015", 2 pgs.

"European Search Report for Application No. 15159617.8, Search Completed Oct. 19, 2015", 3 pgs.

"Extended European Search Report for European Application No. 15159397.7, Search Completed Sep. 16, 2015", 5 pgs.

"European Search Report for Application No. 14177851, Search Completed Oct. 16, 2014", 1 pg.

"European Search Report for European Application No. 14176645, Search Completed Dec. 1, 2014", 1 pg.

"Extended European Search Report for European Application No. 16160622.3, Search Completed Jul. 21, 2016, Mailed Aug. 17, 2016", 7 pgs.

"European Search Report for European Application No. 16174185, Search Completed Dec. 6, 2016", 2 pgs.

"European Search Report for European Application No. 16160621, Search Completed Oct. 5, 2016", 2 pgs.

"Extended European Search Report for European Application No. 16169216.5, Search Completed Sep. 21, 2016, Mailed Sep. 29, 2016", 12 pgs.

"Extended European Search Report for European Application No. 17153506, Search Completed Oct. 5, 2017", 13 pgs.

"Extended European Search Report for European Application No. 17191553.1, Search Completed Mar. 22, 2018, Mailed Apr. 9, 2018", 5 pgs.

"Extended European Search Report for European Application No. 17187922.4, Search Completed Feb. 21, 2018, Mailed Mar. 6, 2018", 7 pgs.

"Extended European Search Report for European Application No. 18150797.1, Search Completed Jun. 29, 2018, Mailed Jul. 9, 2018", 7 pgs.

"Extended European Search Report for European Application No. 18154140.0, Search Completed Aug. 16, 2018, Mailed Sep. 4, 2018", 5 pgs.

"European Search Report for European Application No. 19172550. Search Completed Dec. 11, 2019", 1 pg.

"European Search Report for European Application No. 20155217, Search Completed Jul. 20, 2020", 1 pg.

"Extended Search Report for European Application No. 20171308.8, Search Completed Oct. 30, 2020, Mailed Nov. 12, 2020", 17 pgs.

"Extended European Search Report for European Application No. 21185599.4, Search Completed Jan. 4, 2022, Mailed Jan. 17, 2022", 6 pgs.

"Extended European Search Report for European Application No. 21191090.6, Search Completed May 12, 2022, Mailed May 19, 2022", 9 pgs.

"Dither", Wikipedia, Retrieved from https://en.wikipedia.org/w/index.php?title=Dither&oldid=762118152 on Oct. 5, 2017, 9 pgs.

"Ordered Dithering", Wikipedia, Retrieved from https://en.wikipedia.org/w/index.php?title=Ordered_dithering&oldid=759840417 on Oct. 5, 2017, 3 pgs.

Berry et al., "Programmable Aperture Plate for Maskless High-Throughput Nanolithography", Journal of Vacuum Science & Technology, vol. B15, No. 6, Nov./Dec. 1997, pp. 2382-2386.

Borodovsky, Yan, "EUV, EBDW—ArF Replacement or Extension?", KLA—Tencor Lithography User Forum, San Jose, CA, USA, Feb. 21, 2010, 21 pgs.

Borodovsky, Yan, "MPProcessing for MPProcessors", SEMATECH Maskless Lithography and Multibeam Mask Writer Workshop, New York, NY, USA, May 10, 2010, 35 pgs.

Disclosed Anonymously, "Multi-Tone Rasterization, Dual Pass Scan, Data Path and Cell Based Vector Format", IPCOM000183472D, printed from ip.com PriorArtDatabase, May 22, 2009, pp. 1-107.

Hinterberger, F., "Ion Optics with Electrostatic Lenses", University of Bonn, Germany, 2006, 18 pgs.

Huber et al., "Computing Straight Skeletons and Motorcycle Graphs: Theory and Practice", Thesis, University of Salzburg (Austria), Jun. 2011, 134 pgs.

Kapl et al., "Characterization of CMOS Programmable Multi-Beam Blanking Arrays as used for Programmable Multi-Beam Projection Lithography and Resistless Nanopatterning", Journal of Micromechanics and Microengineering, vol. 21, Mar. 24, 2011, pp. 1-8.

Kim et al., "Binary-Encounter-Dipole Model for Electron-Impact Ionization", Physical Review A, vol. 50, No. 5, Nov. 1994, pp. 3954-3967.

Li et al., "Through-Silicon Interposer Technology for Heterogeneous Integration", Future Fab International, Issue 45, Apr. 25, 2013, 6 pgs.

Munro, E., "Finite Difference Programs for Computing Tolerances for Electrostatic Lenses", Journal of Vacuum Science & Technology B, Jun. 4, 1988, vol. B6, No. 3, May/Jun. 1988, pp. 941-948.

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24-140 Gbps) Optical Data Link, Well Adapted for Future Maskless Lithography Applications", Proceedings SPIE, vol. 7271, 2009, pp. L1-L11.

Platzgummer et al., "eMET—50keV Electron Mask Exposure Tool Development Based on Proven Multi-Beam Projection Technology", Proceedings SPIE, vol. 7823, 2010, pp. 782308-1-782308-12.

Platzgummer et al., "eMET POC: Realization of a Proof-of-Concept 50 keV Electron Multibeam Mask Exposure Tool", Proceedings SPIE, vol. 8166, 2011, pp. 816622-1-816622-7.

Shih, Frank Y., "Image Processing and Mathematical Morphology: Fundamentals and Applications", CRC Press, 2009, pp. 26-32.

Vink et al., "Materials with a High Secondary-Electron Yield for Use in Plasma Displays", Applied Pphysics Letters, vol. 80, No. 12, Mar. 25, 2002, pp. 2216-2218.

Wheeler et al., "Use of Electron Beams in VLSI", G.E.C. Journal of Science and Technology, vol. 48, No. 2, 1982, pp. 103-107.

(56) References Cited

OTHER PUBLICATIONS

Zhang et al., "Integrated Multi-Electron-Beam Blanker Array for Sub-10-nm Electron Beam Induced Deposition", Journal of Vacuum Science & Technology, vol. B24, No. 6, Nov./Dec. 2006, pp. 2857-2860.

* cited by examiner

PATTERN DATA PROCESSING FOR PROGRAMMABLE DIRECT-WRITE APPARATUS

REFERENCE TO RELATED APPLICATIONS

The current application claims priority to European patent application No. 21175588.9, which was filed on May 25, 2021, and which is incorporated herein by reference.

FIELD OF THE INVENTION AND BACKGROUND OF THE INVENTION

The invention relates to a writing process in a programmable charged-particle multi-beam apparatus for processing (in particular nanopatterning or semiconductor lithography) or inspection of a target. More in detail, the invention relates to a method for performing a writing process of a desired pattern onto a target using at least one charged-particle multi-beam apparatus, wherein said desired pattern is provided as input pattern data coded in a vector format, wherein said apparatus includes an illumination system, a pattern definition system, and a projection optics, wherein the illumination system is configured to produce a charged-particle beam and direct it onto the pattern definition system, the pattern definition system is configured to form the charged-particle beam into a multitude of sub-beams representing the pattern, and the projection optics system serves to project the multitude of sub-beams onto the target; as well as a multi-beam apparatus of this type.

This type of writing process and multi-beam configuration is described in U.S. Pat. Nos. 7,214,951, 8,183,543 and 9,443,699 B2 of the applicant.

The applicant has developed several solutions and techniques suitable in the field of charged-particle multi-beam lithography and nanopatterning and pertinent technology, such as the following: when using ion multi-beams coined CHARPAN (charged particle nanopatterning) and when using electron multi-beams coined eMET (electron mask exposure tool) or MBMW (multi-beam mask writer) for mask writing, and coined PML2 (Projection Mask-Less Lithography) for direct write lithography on substrates, in particular silicon wafers. In this context, relevant patent documents in the name of the applicant are U.S. Pat. Nos. 7,199,373, 7,214,951, 8,304,749, 8,183,543, and 8,222,621, the disclosure of which is herewith incorporated by reference.

During writing a pattern on a target such as a 6" mask blank or silicon wafer substrate, there are non-ideal situations which have to be taken into account during the multi-beam writing process in order to realize a mask or wafer with desired features and pattern fidelity. Possible problems to be taken into account are e.g. distortions of the substrate due to processing, distortions of the beam array field which cannot be corrected via optical deflection means, "loading effects" in a subsequent etching process, or charge induced influences. These effects can be simulated and/or measured. In particular, corresponding data may be provided beforehand when preparing the data file for the patterns to be printed with the multi-beam writer ("data based correction"), or some or all of these effects may be calculated on basis of a model of the effect ("model based correction"). In most cases it will be found that corrections have to be done for portions of the substrate area ("substrate segments") which are smaller than the size (area) of the beam array field, in order to meet the high demands of modern and future nanolithography technology.

For industrial applications, such demands are expressed as performance requirements with respect to achieving a small Critical Dimension (CD) and Registration Error (REG) and, in particular, to achieving 3sigma or 6sigma variations at a nanometer level of the Local CD Uniformity (LCDU) and Local Registration Error (LREG) within small fields (e.g. the area of the MBW beam array field) as well as nanometer level 3sigma or 6sigma variations of the Global CD Uniformity (GCDU) and Global Registration Error (GREG) over the whole MBW writing field on a substrate (e.g. a 6" mask blank or a 300 mm Silicon wafer).

A further important aspect with regard to industrial applications is the throughput in high-volume manufacturing, in particular in the application in mask-less lithography or direct writing to silicon wafer substrates. A simple approach by scaling up providing the required number of charged particle multi-beam writers to increase the throughput by orders of magnitude would be problematic, since it neglects the high redundancy of repeating process steps, in particular with respect to pattern preprocessing steps.

SUMMARY OF THE INVENTION

In view of the above, it is an aim of the invention to overcome the above-noted problems, and in particular, to provide an architecture of the pattern data processing which can take advantage of high redundancy and which can deal with the mentioned adversary effects that may affect the pattern fidelity, while at the same time obtaining an effective handling of the computations and time requirements. This will also include proper handling of real-time effects.

The mentioned aims are achieved by a method for performing a writing process of the type described above, which comprises (at least) the following steps which are performed at a data preprocessing system, preferably independently of—for instance, well in advance to—the writing process:

receiving the input pattern data,
preprocessing the input pattern data using writing parameter data provided to the data preprocessing system so as to obtain intermediate pattern data, and
writing the intermediate pattern data to a data storage;

and which further comprises (at least) the following steps carried out during initialization and/or performing a writing process using said at least one apparatus, by means of at least one writing control system associated therewith:

reading the intermediate pattern data from the data storage,
converting the intermediate pattern data to obtain pattern streaming data, and
streaming the pattern streaming data to at least one pattern definition system of said at least one apparatus, each pattern definition system forming a respective charged-particle beam of said at least one apparatus into said multitude of sub-beams during the writing process in accordance with said pattern streaming data.

This solution divides the processing of the pattern data into two main sections, namely, a first section which is carried out at the data preprocessing system, typically before an actual writing process, and a second section which is typically done when a writing process is performed. This allows a time-efficient handling of the pattern data processing while keeping low the amount of calculations during the writing process.

In many embodiments it may be advantageous if the preprocessing of the input data at the data preprocessing system includes: dividing the input pattern data coded in a vector format into a plurality of geometric basic elements; and/or applying a geometry and/or dose correction to the input pattern data or geometric basic elements so as to compensate for deviations from ideal writing conditions determined in advance to the writing process, wherein the geometry and/or dose correction is carried out using correction data which are supplied as external data. These external data may be derived from previous writing processes, and/or test processes, and/or model-based simulations of such processes.

In many embodiments of the invention the intermediate pattern data are in vector format. In such cases, the preprocessing of the input data at the data preprocessing system will generate preprocessed intermediate pattern data in vector format, which are written as intermediate pattern data to the data storage. Furthermore, the initialization of the writing process, or the writing process itself as performed by means of the writing control system(s) may include, after reading the intermediate pattern data from the data storage, converting the input pattern data so as to obtain raster graphics data which represent at least a part of the desired pattern in a raster graphics format.

In other embodiments, the intermediate pattern data are raster graphics data with respect to a raster to be used during the writing process. In such cases, the preprocessing of the input data at the data preprocessing system will usually include converting the input pattern data so as to obtain raster graphics data which represent at least a part of the desired pattern in a raster graphics format. Furthermore, the steps carried out during a writing process may further include: applying a geometry and/or dose correction to the raster graphics data so as to compensate for deviations from ideal writing conditions determined during the writing process; and/or dithering pixel data during which the data are converted so as to conform with a predetermined gray value scale; and/or packaging pixel data into a data format which allows the pixel data to be streamed at a transmission speed required by the writing process. The mentioned dose correction to the raster graphics data may include global dose corrections, e.g. for an area covering many pixels, and/or local dose corrections, e.g. an aperture specific dose correction, or in other words, a pixel gray-level correction. The step of packaging the pixel data may include a re-ordering of the data so as to conform to the writing sequence of pixels on the target (in other words, to the placement grid sequence). This will provide the sequence of pixel data in correspondence to the sequence of aperture images generated on the target, sorted according to the placement grid sequence, at a transmission speed required by the writing process.

In further embodiments, the preprocessing of the input data at the data preprocessing system may include as further processing steps, after converting to raster graphics data but before writing the data thus processed as intermediate pattern data to the data storage: applying a geometry and/or dose correction to the raster graphics data so as to compensate for deviations from ideal writing conditions determined during the writing process; and/or dithering pixel data which includes converting the data so as to conform with a predetermined gray value scale; and/or packaging pixel data into a data format which allows the pixel data to be streamed at a transmission speed required by the writing process. The step of packaging the pixel data may include a re-ordering of the data as mentioned above.

The writing process according to the invention may take place in several writing apparatuses concurrently. Thus, it may substantially increase the throughput by having the step of reading the intermediate pattern data from the data storage and subsequent steps carried out by two or more separate writing processes taking place in different charged-particle multi-beam apparatuses, preferably simultaneously. Furthermore, the charged-particle multi-beam apparatus may comprise two or more multi-beam columns arranged in parallel (as illustrated in FIG. 1; also see FIG. 7), and the step of reading the intermediate pattern data from the data storage and subsequent steps are carried out in said multi-beam columns at least partly in parallel on one or more targets. Advantageously, these multi-beam columns arranged in parallel may comprise at least two distinct illumination systems, each illumination system comprising its own particle source; thus, each illumination system will supply beam particles to column(s) that are different from the column(s) associated with other illumination system(s). Preferably each of the multi-beam columns comprises a respective (i.e., its own) illumination system, and in particular its own particle source.

The method according to the invention is suitably carried out in a charged-particle multi-beam apparatus that is configured to perform such a writing process and is provided with a writing control system configured to: access a data storage to retrieve intermediate pattern data which contain preprocessed pattern data of the desired pattern, convert the intermediate pattern data to obtain pattern streaming data, and stream the pattern streaming data to the pattern definition system, directing the pattern definition system to form the charged-particle beam into said multitude of sub-beams during the writing process in accordance with said pattern streaming data. The writing control system may, moreover, be configured to retrieve and process the intermediate pattern data during initialization and/or performing a writing process performed in said apparatus. In addition, the writing control system may be further configured to perform one, several or all of the following steps after retrieving the intermediate pattern data: converting the pattern data so as to obtain raster graphics data which represent at least a part of the desired pattern in a raster graphics format; and/or applying a geometry and/or dose correction to the raster graphics data so as to compensate for deviations from ideal writing conditions determined during the writing process; and/or dithering pixel data so as to conform with a predetermined gray value scale; and/or packaging pixel data into a data format which allows the pixel data to be streamed at a transmission speed required by the writing process (where packaging the pixel data may include a re-ordering of the data as mentioned above).

BRIEF DESCRIPTION OF THE DRAWINGS

In the following, in order to further demonstrate the present invention, illustrative and non-restrictive embodiments are discussed, as shown in the drawings, which schematically show.

DETAILED DESCRIPTION OF EMBODIMENTS OF THE INVENTION

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention. Within this disclosure, terms relating to a vertical direction, such as "upper" or "down", are to be understood with regard to the direction of the beam, which is thought to run downwards along a longitudinal direction ("vertical axis"). This vertical axis, in turn, is identified with the Z direction, to which the X and Y directions are transversal.

The embodiments discussed in the following disclose approaches for efficient handling of the pattern image data to be written to a target in a writer tool.

Lithographic Apparatus

Figure 1:
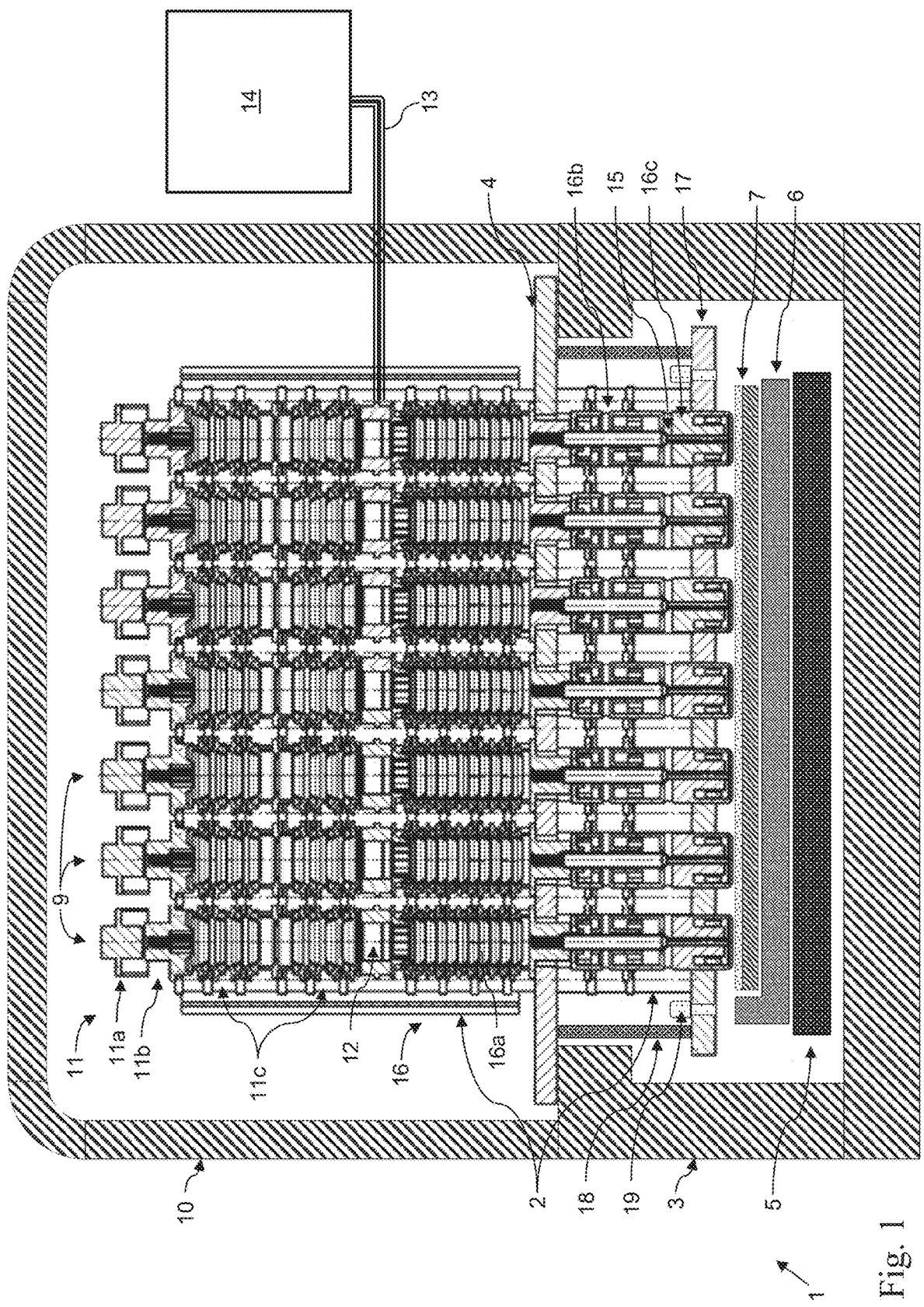
FIG. 1 a multi-column writer tool according to the invention in a schematic sectional view.

FIG. 1 shows a schematic sectional view of a multi-column writer tool 1 with vacuum housing 10 for the multi-column charged-particle optics 2, a target chamber 3 onto which the multi-column charged-particle optics is mounted by means of a column base plate 4. Within the target chamber 3 is an X-Y stage 5, e.g. a laser-interferometer controlled air-bearing vacuum stage onto which a substrate chuck 6 is loaded using a suitable handling system. The chuck 6, which preferably is an electrostatic chuck, holds the substrate 7, such as a silicon wafer serving as target. For charged-particle multi-beam lithography the substrate, for instance, is covered with an electron or ion beam sensitive resist layer.

The multi-column optics 2 comprises a plurality of sub-columns 9 (the number of columns shown is reduced in the depiction for better clarity, and represent a much larger number of columns that are present in the multi-column apparatus in a realistic implementation). Preferably, the sub-columns 9 have identical setup and are installed side-by-side with mutually parallel axes. Each sub-column has an illuminating system 11 including an electron or ion source 11a, an extraction system 11b, and an electrostatic multi-electrode condenser optics 11c, delivering a broad telecentric charged-particle beam to a pattern definition (PD) system 12 being adapted to let pass the beam only through a plurality of apertures defining the shape of sub-beams ("beamlets") permeating said apertures (beam shaping device), and a demagnifying charged-particle projection optics 16, composed of a number of consecutive electro-magneto-optical projector stages, which preferably include electrostatic and/or magnetic lenses, and possibly other particle-optical devices. In the embodiment shown in FIG. 1, the projection optics 16 comprises e.g. three lenses: The first lens is an accelerating electrostatic multi-electrode lens 16a whereas the second and third lenses 16b, 16c are either magnetic lenses, in particular when using electrons, or electrostatic lenses, for instance in the case where the particles are ions.

The accelerating first lens of the projection charged-particle optics 16 provides the important advantage of operating the PD system 12 at low kinetic energy of the particles (e.g. 5 keV) whereas providing high beam energy (e.g. 50 keV) at the cross-overs of the demagnifying projection optics, thus minimizing stochastic Coulomb interactions. Further, the high beam energy at the substrate is beneficial to reduce forward scattering of the charged particles when exposing the target, in particular the charged-particle sensitive layer 8.

The first lens of the projection optics forms a first cross-over whereas the second lens forms a second cross-over. At this position in each sub-column there is a stopping plate 15 configured to filter out beams deflected in the PD system. The third lenses 16c of the sub-columns as well as the stopping plates 15 are mounted onto a reference plate 17 which is mounted by suitable fastening means 18 onto the column base plate 4. Mounted onto the reference plate 17 are parts 19 of an off-axis optical alignment system.

The reference plate is fabricated from a suitable base material having low thermal expansion, such as a ceramic material based on silicon oxide or aluminum oxide, which has the advantage of little weight, high elasticity module and high thermal conductivity, and may suitably be covered with an electrically conductive coating, at least at its relevant parts, in order to avoid charging (by allowing electrostatic charges being drained off).

Figure 2:
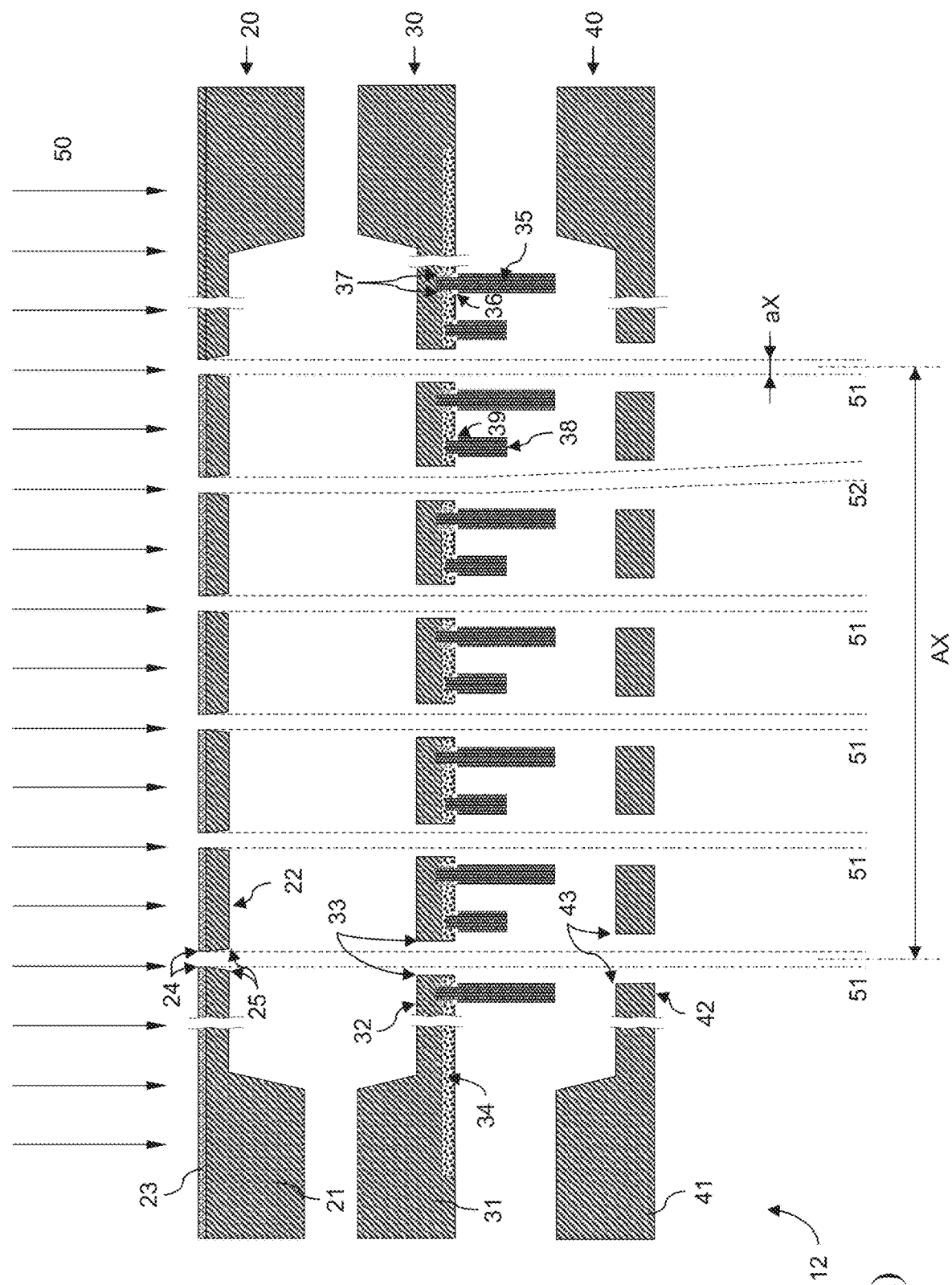
FIG. 2 a pattern definition system according to state of the art in a longitudinal section.

As can be seen in the longitudinal sectional detail of FIG. 2, a PD system 12 according to prior art comprises three plates stacked in a consecutive configuration: An aperture array plate 20 (AAP), a deflection array plate 30 (DAP, also referred to as blanking array plate) and a field-boundary array plate 40 (FAP). It is worthwhile to note that the term 'plate' is refers to an overall shape of the respective device, but does not necessarily indicate that a plate is realized as a single plate component even though the latter is usually the preferred way of implementation; still, in certain embodiments, a 'plate', such as the AAP, may be composed of a number of sub-plates. The plates are preferably arranged parallel to each other, at mutual distances along the Z direction.

The flat upper surface of AAP 20 forms a defined potential interface to the condenser optics 11. The AAP may, e.g. be made from a square or rectangular piece of a silicon wafer (approx. 1 mm thickness) 21 with a thinned center part 22. The plate may be covered by an electrically conductive protective layer 23, which will be particularly advantageous when using hydrogen or helium ions (line in U.S. Pat. No. 6,858,118). When using electrons or heavy ions (e.g. argon or xenon), the layer 23 may also be silicon, provided by the surface section of 21 and 22, respectively, so that there is no interface between layer 23 and bulk parts 21/22, respectively.

The AAP 20 is provided with a plurality of apertures 24 formed by openings traversing the thinned part 22. In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror-charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by postprocessing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path. The electrodes 38 as well may have a retrograde section 39 in order to avoid charging. Each of the electrodes 38 is connected at its base portion to a respective contact site within the CMOS circuitry 34.

The height of the ground electrodes 35 is higher than the height of the deflection electrodes 38 in order to suppress cross-talk effects between the beams.

The deflection electrodes 38 are selectively activated and controlled by means of data and controlling signals, which are supplied to the DAP 30 during a writing process in real time. These data and controlling signals are collectively referred to as streaming pattern data. Referring to FIG. 1, the streaming pattern data are supplied to the PD systems 12 by a controller system 14 of the writer tool 1 via a bundle of data lines, collectively referenced as data path line 13 in FIG. 1.

The third plate 40 serving as FAP has a flat surface facing downstream to the first lens part of the demagnifying charged-particle projection optics 16, thus providing a defined potential interface to the first lens 16a of the projection optics. The thicker part 41 of FAP 40 is a square or rectangular frame made from a part of a silicon wafer, with a thinned center sect ion 42. The FAP 40 is provided with a plurality of openings 43 which correspond to the openings 24, 33 of the AAP 20 and DAP 30 but are wider as compared to the latter.

The PD system 12, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beams 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the substrate.

The reduction factor of the demagnifying charged-particle optics 16 is chosen suitably in view of the dimensions of the beams and their mutual distance in the PD system 12 and the desired dimensions of the structures at the target. This will allow for micrometer-sized beams at the PD system whereas nanometer-sized beams are projected onto the substrate.

The ensemble of (unaffected) beams 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The beam size of an individual sub-beam at the substrate is given by $bX=aX/R$ and $bY=aY/R$, respectively, where aX and aY denote the sizes of the beam 51 as measured along the X and Y directions, respectively, at the level of the DAP 30.

It is worthwhile to note that the individual beams 51, 52 depicted in FIG. 2 (as well as in the analogous figures below) represent a much larger number of sub-beams, typically many thousands, arranged in a two-dimensional X-Y array. The applicant has, for instance, realized multi-beam charged-particle optics with a reduction factor of R=200 for ion as well as electron multi-beam columns with many thousands (e.g., 262, 144) programmable beams. The applicant has realized such columns with a beam array field of approx. 82 μm×82 μm at the substrate. These examples are stated for illustrative purpose, but are not to be construed as limiting examples.

The arrangement outlined in FIG. 3 is used to implement sub-columns with such a diameter that a large number of sub-columns of the above-described kind fit within the area of a substrate, such as a 300 mm silicon wafer used as a substrate for leading-edge integrated circuit device production. There is ongoing development of 193 nm immersion optical lithography, EUV and nano-imprint lithography tools for 450 mm silicon wafer size. Without loss of throughput, the multi-column configuration as presented here can easily be adapted to any other wafer size, such as a 450 mm diameter silicon wafer size, by providing a corresponding higher number of sub-columns.

The various embodiments shown in the following relate to a multi-beam tool where the substrate (e.g., silicon wafer) is exposed e.g., with a 193 nm immersion scanner tool with die-fields having length DX and width DY of typically DX=33 mm and DY=26 mm. Multi-beam tools of this type are described in US 2015/0311031 A1 and U.S. Pat. No. 9,443,699 of the applicant, whose teachings are hereby included by reference into the present disclosure. One die field may, and typically will, comprise several chips. The many embodiments are not limiting, and thus the invention may refer to other layouts and applications as well.

Figure 3A:
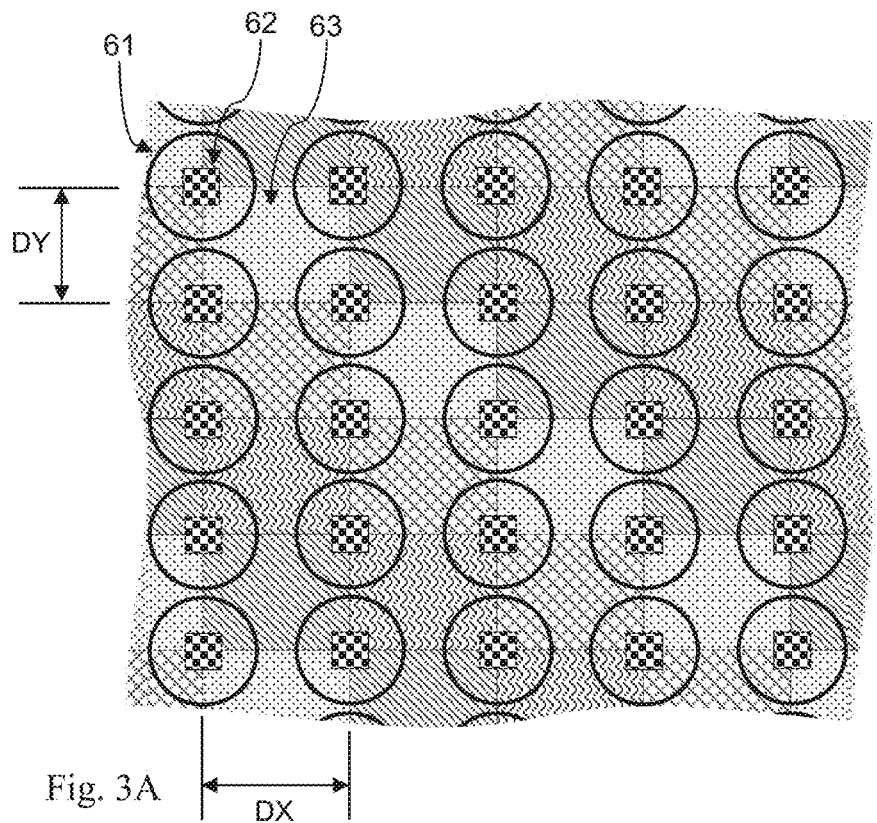
FIG. 3A shows a first arrangement of the columns with regard to the target in a partial plan view (rectangular arrangement)
Figure 3B:
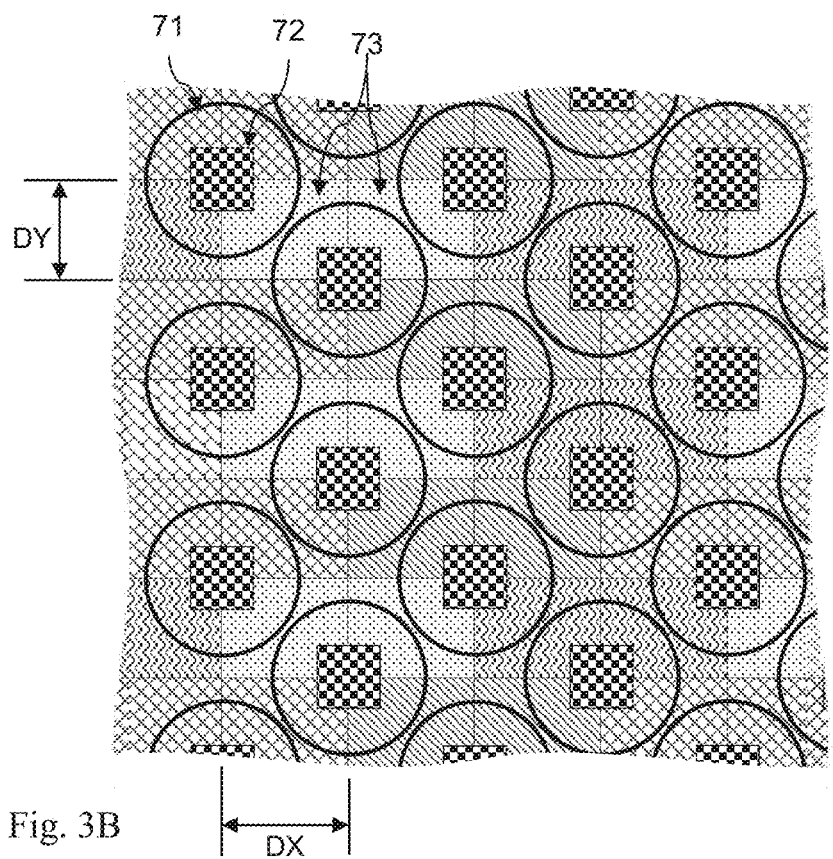
FIG. 3B shows a second arrangement of the columns (rhombic arrangement)

Exemplary embodiments of compact sub-columns arrangements 60 and 70 suitable for the invention are shown in FIGS. 3A and 3B, respectively, which show plan view details of the arrangements with regard to the plane of the target. In FIG. 3A a "rectangular" layout is depicted, wherein one sub-column 61 (symbolically represented by a circle) with an aperture array field 62 is respectively used to expose the area 63 of one die field (as illustrated by different ways of hatching); consequently, the mutual arrangement of columns reflected the mutual arrangement of the die fields. FIG. 3B illustrates a "rhombic" arrangement of the columns, where one sub-column 71 with an aperture array field 72 is respectively used to expose the area 73 of two die fields, and the distance between two neighboring columns corresponds to a diagonal of a single die field.

Assuming DX=33 mm and DY=26 mm, then in case of FIG. 3A the diameter of a sub-column 61 is approx. 24 mm and the size of the aperture array field 62 is approx. 8.2 mm×8.2 mm, whereas in case of FIG. 3B the diameter of a sub-column 71 is approx. 40 mm and the aperture array field 72 is approx. 16.4 mm×16.4 mm. Assuming the periodicity of the apertures is 16 μm, the aperture array field 62 is able to provide 512×512=262,144 beams, whereas the aperture array field 72 is able to provide 1024×1024=1,048,576 beams.

Evidently, the multi-column layout described above requires that, in order to properly control the multitude of PD systems of the multicolumn apparatus, a large number of data and controlling signals are supplied as input signals to the DAPs. Further, additional control lines for reading out the deflector devices may be present to provide output signals. These input and output lines of the DAPs are collectively referred to as the data path.

In particular, the data path comprises, for instance, fiber optical and/or electrical line components (e.g., flatband cables) as described in US 2015/0311031 A1 and U.S. Pat. No. 9,443,699 of the applicant.

Writing a Pattern

Figure 4A:
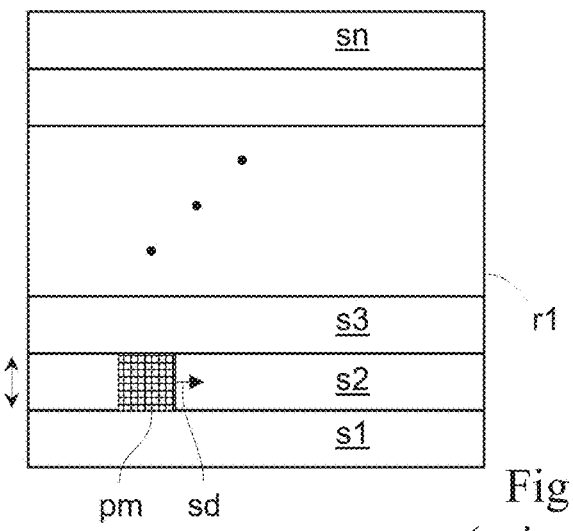
FIG. 4A illustrates the basic writing strategy on the target using stripes.

Referring to FIG. 4A, a pattern image pm as defined by the PD system 4 is produced on the target 7. The target surface covered with the charged-particle sensitive resist layer 8 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of the invention only the relative motion of the pattern image pm on the target is relevant. By virtue of the relative movement the pattern image pm is moved over the area r1 so as to form a sequence of stripes s1, s2, s3, ... sn (exposure stripes) of width y0. The complete set of stripes covers the total area of the substrate surface. The scanning direction sd may have uniform orientation, or it may have alternate direction of movement from one stripe to the next.

Figure 5A:
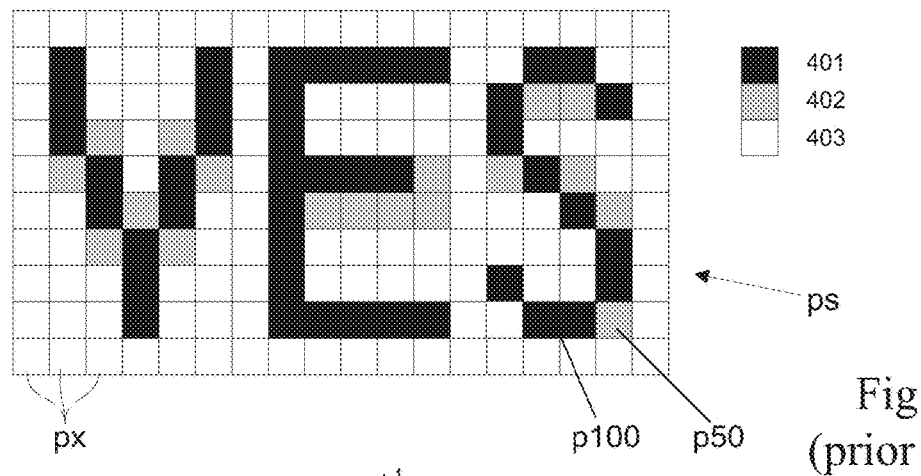
FIGS. 5A and 5B show an example of a pixel map of an exemplary pattern to be exposed.
Figure 5B:
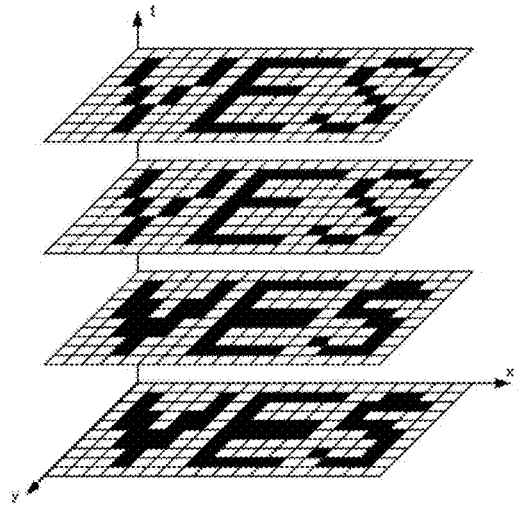

FIG. 5A shows a simple example of an imaged pattern ps with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). FIG. 5B illustrates how a 50% level is realized: each pixel is exposed several times, and for a pixel with a gray level between 0 and 100%, the gray level is realized by choosing a corresponding number of the exposures with the pixel activated; the gray level is the fraction of activated exposures over the total number of exposures. In this example, a 50% level is realized by choosing 2 out of 4. Of course, in a realistic application of the invention, the number of pixels of the standard image would be much higher. However, in FIGS. 5A+B the number of pixels is only 180 for the better clarity. Also, in general, much more gray levels will be used within the scale from 0% to 100%.

Thus, the pattern image pm (FIG. 4A) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1) \ldots, i/(n_y-1), \ldots, 1$ with $n_y$ being the number of gray values and i being an integer ("gray index", $0 \le i \le n_y$). Generally, however, the gray values need not be equidistant and form a non-decreasing sequence between 0 and 1.

Figure 4B:
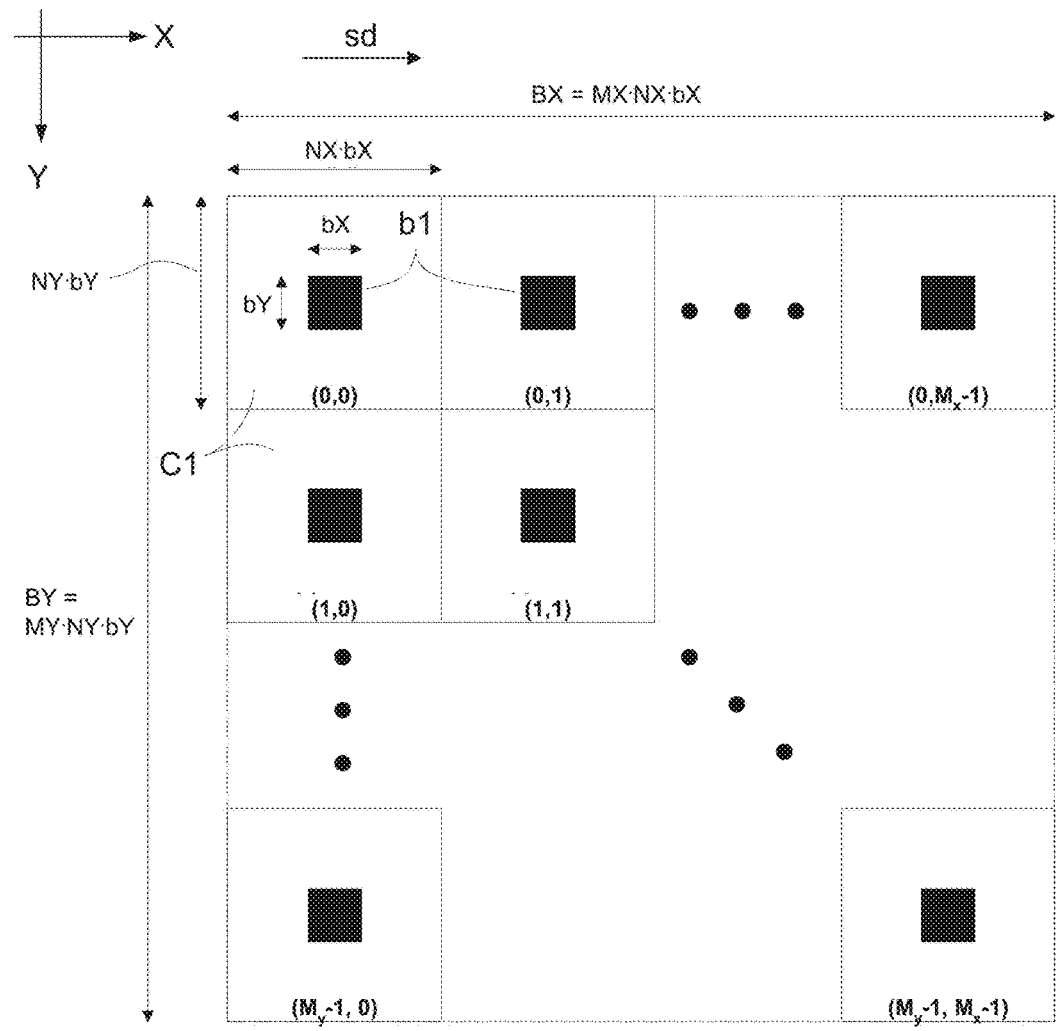
FIG. 4B shows an exemplary arrangement of apertures as imaged onto the target.

FIG. 4B shows a preferred arrangement of apertures in the aperture field of the PD system, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX·bX and NY·bY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
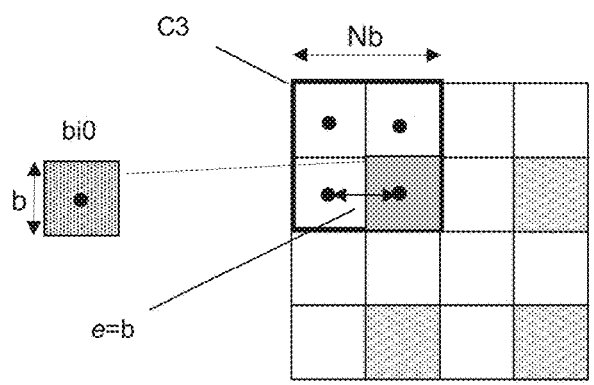
FIG. 6A illustrates an arrangement of apertures with M=2, N=2.

The pitch between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. Nos. 8,222,621 and 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
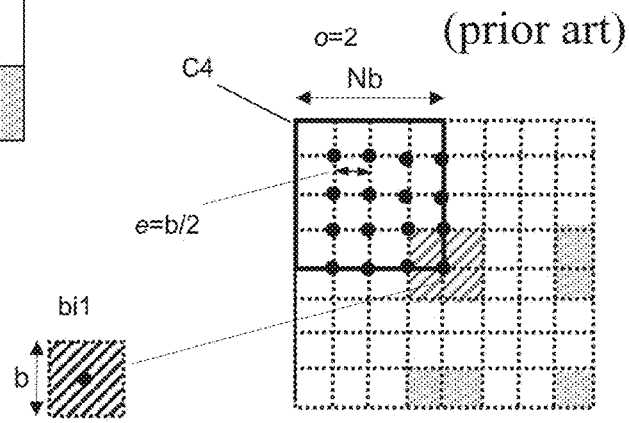
FIG. 6B shows an example of oversampling of the pixels in a "double grid" arrangement.

FIG. 6B illustrates one example of an oversampling of o=2 combined with placement grids, referred to as "double-grid": namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8. The parameter o may also be assigned a non-integer value greater one, such as $2^{1/2}=1.414$ or $2^{3/2}=2.828$, corresponding to the case of the "Double-Centered Grid" shown in U.S. Pat. No. 9,653,263.

It is worthwhile to note that with interlocking grids (o>1) it is possible to increase the number of gray shades by "dithering" while the dose distribution remains homogeneous. The basis for this is that the grey shades on any nominal grid are equal. This means that for the double interlocking grid the number of effective dose levels that can be realized is four times higher than for the non-interlocking grid. Generally speaking any oversampled exposure grid (i.e., >1) consists of up to $o^2$ nominal grids shifted by distances b/o in X and Y direction. Thus, the step from one dose level to the next can be divided into o sub-steps where the dose level of only one of these o grids is increased; this can be repeated for the other grids until all sub-grids expose the nominal level. As the skilled person will appreciate, the beam shape at the substrate is the convolution of the machine blur and the reduced aperture shape of the aperture plate. It is possible to obtain a homogeneous dose distribution on the substrate by setting the width b to a natural multiple of the exposure grid constant e; in other words, making o=b/e an integer. Otherwise the dose distribution may have minima and maxima with a periodicity of the exposure grid, by virtue of aliasing effects. A high number of gray shades allows better feature placement. Therefore increasing the gray levels is of relevance where the gray shades per pixel position are limited to a certain number.

Pattern Data Processing

According to the invention, the writer tool comprises a data processing system which converts the pattern to be written into a representation of dose assignment defined on a raster, such as gray level assignments to a pixel array on the target, or beamlet dose assignments; each with respect to the beam array fields of the individual columns as formed by their respective PD systems. Typically, the pattern will be written repeatedly on the same substrate, e.g. to multiple dies on a silicon wafer in a direct-write scenario, and/or successively to multiple mask blanks in a mask-write scenario. The writer tool processing system consists of two major parts:

(1) a first section, which is configured to preprocess pattern data independently, preferably in advance, of the writing process, so as to generate intermediate data and to store the intermediate data to a storage where the intermediate data can be kept for a possibly prolonged time period. This first section may be realized as a dedicated separate system, which is also referred to as "data preprocessing unit" or "Data Center", depicted in FIG. 7 as unit 101. The skilled person will appreciate that this section may also be realized otherwise, such as in form of a distributed computer network; and (2) a second section, which is configured to continue the data processing flow during a writing process, so as to read the intermediate data from the storage, possibly apply some further processing steps to the data, and convert the data into streaming data and streaming the streaming data to the individual column PD systems in real time during the writing process for each substrate exposure. This second section 102 is also referred to as "data streaming unit" or "Data Path". It is usually implemented using individual instances in each of the controller systems of the writer tools, for instance in the example of FIG. 7 as multiple units, symbolically depicted as dotted rectangles 162, each of which is associated with a respective writing system or column of the multi-column writer tool. The skilled person will appreciate that this section 102 may also be realized using other configurations, for instance using one single server computer, or a computer array where each computer of the computer array supports a respective group of columns (or only one single column) of the multi-column writer tool.

Figure 7:
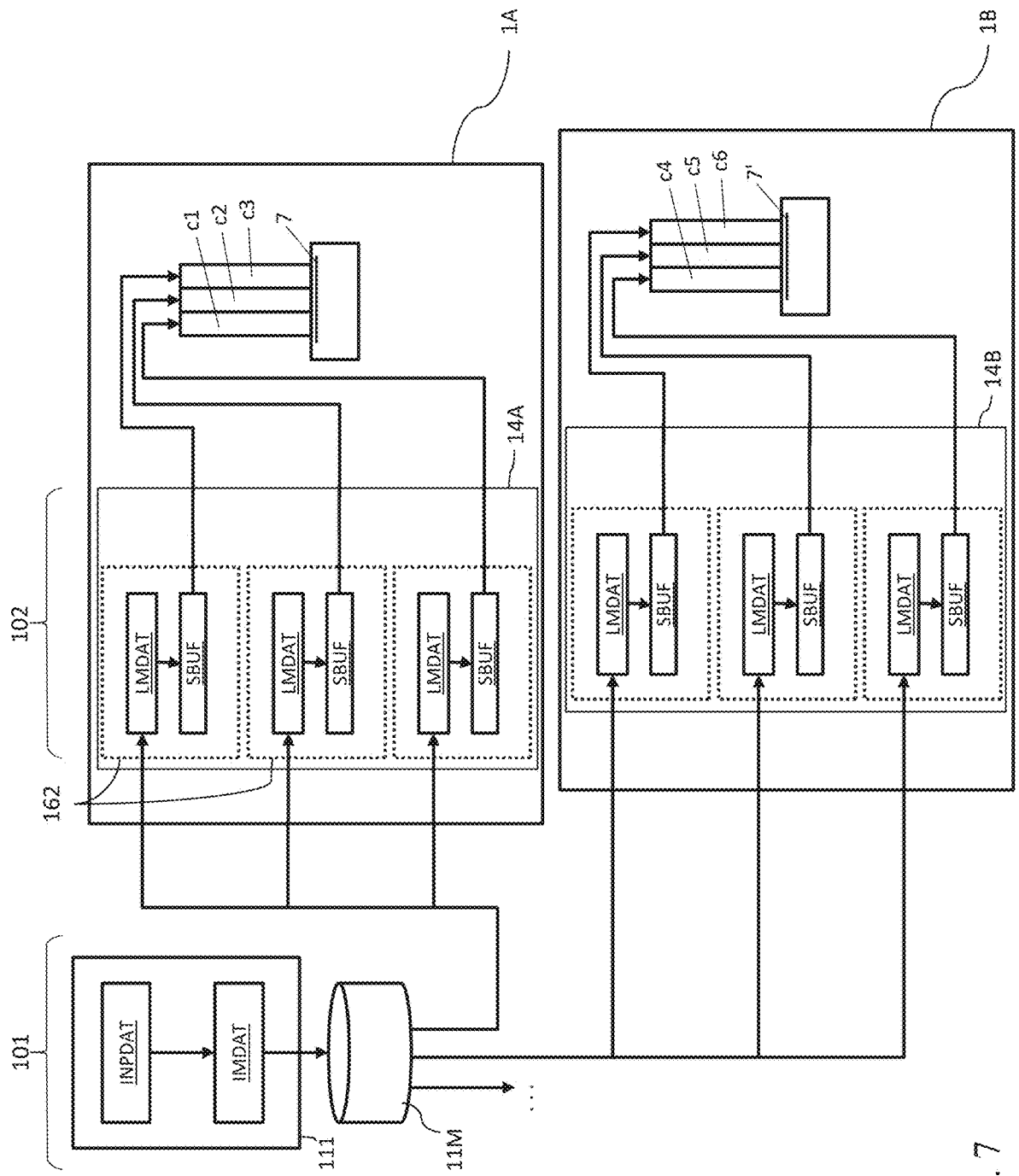
FIG. 7 is an overview of the equipment involved in the pattern data processing flow, which takes place partly upstream of, partly during the writing process in one or more writing tools.

FIG. 7 displays a schematic simplified overview diagram of the pattern data processing flow in a writing system constituted of a multitude of writer tools 1A, 1B and a preprocessing system 101 for preparing pattern data to be written on respective targets 7, 7' which are being processed in the writer tools: The pattern to be written, the input pattern data INPDAT is provided to a data preprocessing station 111 of the preprocessing system 101. The data preprocessing station 111 processes the input pattern data into intermediate data IMDAT and writes them to one or more storage devices 11M, such as a hard-drive based mass storage accessible over a LAN or a dedicated storage system which is specifically provided to the writing system; in the storage devices(s) 11M the intermediate data is stored in a suitable way so as to allow them being accessed by data streaming units 102. In the scenario depicted in FIG. 7, multiple data streaming units 102 access the storage device(s) 11M to retrieve intermediate data, which preferably may take place simultaneously, possibly using respective local intermediate storages LMDAT (for instance, SSD memory) and/or specific additional data processing as described below. Each data streaming unit 102 then streams the data through a buffer storage SBUF (for instance, RAM memory of the controller system) towards a writer tool column which uses the data during a writing process. In the schematic depiction of FIG. 7, two writer tools LW3, LW4, which each comprises a number of columns (of which only three columns c1, c2, c3 and c4, c5, c6, respectively, are shown for each writer tool for better clarity) are supplied the pattern data by a corresponding number of (in FIG. 7 six) data streaming units, all of which access intermediate data IMDAT ultimately from the data preprocessing unit 101. It will be evident that generally the number of writer tools 1A, 1B may be one, two or any other arbitrary number. For each writer tool 1A, 1B, the data streaming units 102 belonging thereto are part of the respective controller 14A, 14B (each corresponding to controller system 14 of FIG. 1).

Pattern Data

In many embodiments the pattern to be written is described in a vector format, e.g. as a collection of geometric elements such as rectangles, trapezoids or general polygons; this typically offers better data compression and therefore reduces the requirements on data storage. The polygon vertex density may serve as measure for the complexity of the pattern, and one typical example of a polygon vertex value is 2000 vertices/$\mu m^2$. Also, typically the pattern is written repeatedly to multiple substrates over a prolonged time period wherein the initial pattern data are preprocessed into intermediated data once and then stored for streaming throughout the prolonged time period. In one typical direct write scenario, the pattern covers the area of a die having side lengths 31 mm×26.8 mm and will require about 13.3 TB of memory storage space considering the mentioned vertex density with 2×4 bytes per vertex.

FIGS. 8 to 11 are schematic illustrations of the pattern data processing flow, with rectangles depicting nodes corresponding to specific data structures or data format stages, and edges (or arrows) represent processing and/or streaming operations. In particular, the first node represents the pattern VECPAT that is supplied in vector format to the data center 101 in form of the input pattern data INPDAT (cf. FIG. 7). Also in FIGS. 8-10, at the left side of each data stage, a symbolic depiction of the respective data stage for an exemplary simple geometric structure is shown. Dashed boxes in FIGS. 8-11 respectively symbolize the sections/units where respective parts of the processing flow are carried out, but beyond that the processors and controller systems performing the pattern data processing flow are, for the sake of clarity, not depicted in these figures, although they are understood and straightforward to implement by the skilled person.

Data Processing

In one group of embodiments of the invention, the data center 101 preprocesses the pattern down to beamlet dose assignments for individual columns, which are used as the intermediate data. During the writing process the tool scans over the substrate, and each data path (for each single column and PD system belonging thereto) streams the intermediate data from the data center to its PD system.

Figure 8:
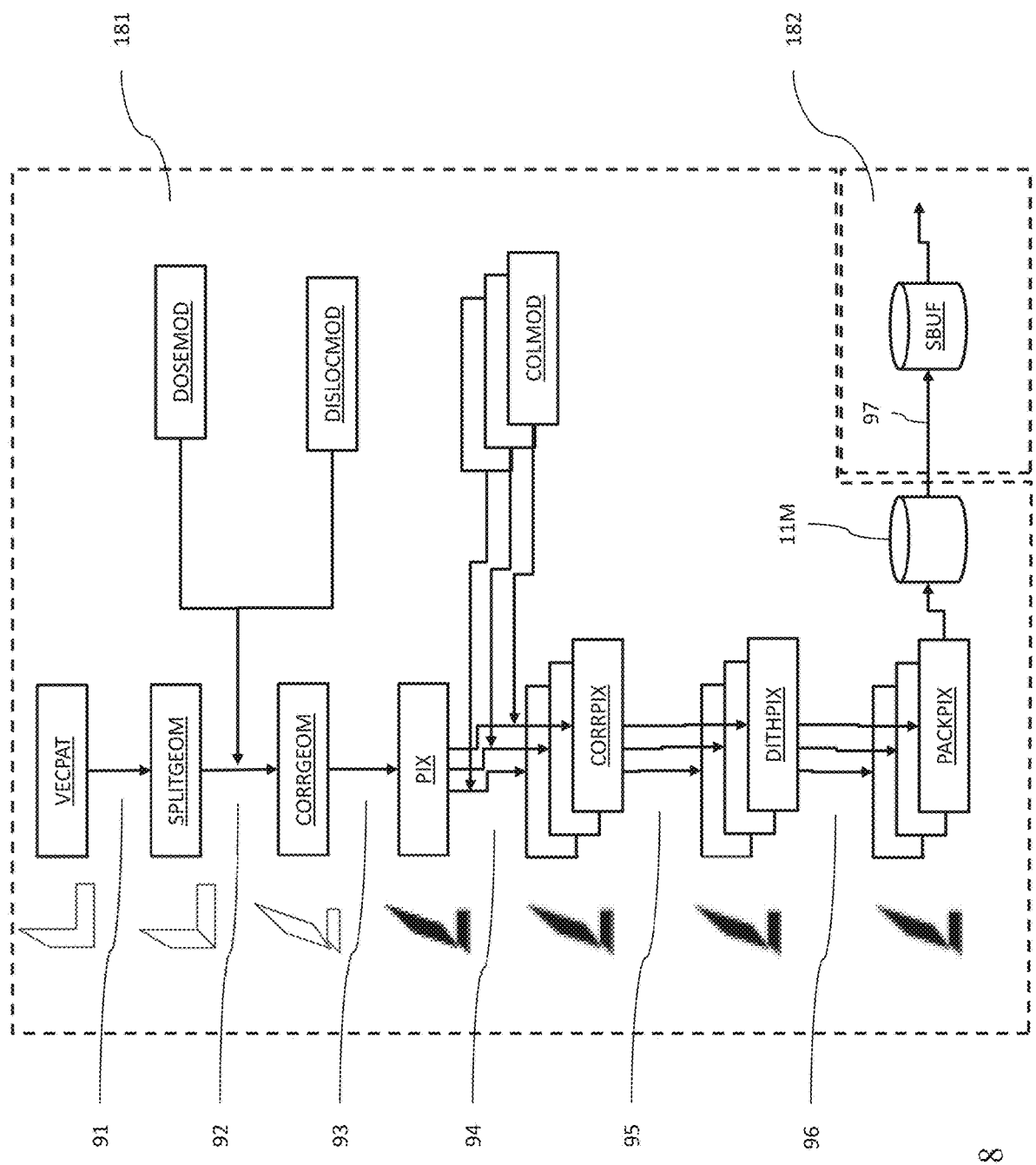
FIG. 8 is a flowchart of the pattern data processing pipeline according to a first embodiment of the pattern data processing flow.

FIG. 8 shows a flowchart of the pattern data processing pipeline in the data center 181 and data path 182 of a first embodiment of the pattern data processing flow.

In a first step 91 the pattern VECPAT is split into a plurality of small data chunks SPLITGEOM, possibly with geometric overlaps, with each chunk e.g. containing one or more geometric elements. In typical embodiments, each chunk may consist of a plurality of polygons where each polygon has less vertices than a predetermined maximum number and edges shorter than a predetermined maximum edge length. For instance, the maximum number of vertices may be a number in the order of 10000, such as 7560 or 8192, and the maximum edge length, a value in the order of 1 μm. This splitting process of step 91 does not take into account any property of the individual columns, and therefore the data does not have to be copied for individual treatment at this stage.

The data preprocessing unit 181 may contain correction subunits that are configured to compensate for non-ideal writing conditions, such as distortions of the substrate due to processing, distortions of the beam array field which cannot be corrected via optical deflection means, "loading effects" arising from previous, parallel or subsequent etching processes, charge-induced influences, and/or other adverse effects. For instance, it may be convenient to apply compensations that affect all columns in the same way at this stage in the vector domain, as a step 92. The corresponding processing may be carried out to all chunks SPLITGEOM independently, possibly in parallel, and the resulting data is sorted and coded in a way to improve computation speed of the following steps. Most commonly, this will involve the variation of nominal dose assigned to these geometries in order to be able to compensate for effects such as fogging due to back scattered electrons, mask processing effects (such as the etch loading effect), and the proximity effect due to forward scattered electrons. This is carried out based on suitable dose correction data DOSEMOD, which can be supplied as external input, obtained, for instance, from model-based and/or measurement-based analyses of the relationship between dose and the critical dimension of features written to the substrate, Suitable methods of dose correction are well-known from prior art. Furthermore, it is possible to include a correction of spatial dislocations transversal to the particle beam by applying transformations to the geometries, such as translation, scaling, or rotation, as described in U.S. Pat. No. 9,568,907 B2. This may be carried out based on dislocation correction data DISLOCMOD, which can be supplied as external input, for instance determined in a similar way from analyses of the relationship between dose and feature dislocations (e.g. due to charging or heating of the substrate or pieces of the exposure apparatus). The result of such analysis is supplied to the correction subunit of the data center in a suitable format, e.g. as parameters of the model, or processed measurement results, which is then used in the correction process of step 92. The step 92 will provide an output, referred to as CORRGEOM in FIG. 8, which is a collection of chunks where all chunks contain a collection of geometric elements.

In a subsequent rasterization step 93, the chunks, more specifically the geometric elements of every chunk, are converted into a raster graphics array PIX, where the pixel gray level represents the physical dose of the corresponding aperture image. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers; only later they are converted to the discrete set of dose values as supported by the PD system. The raster graphics array PIX may also contain a number of sub-grid arrays (which are superimposed in that they are written in subsequent writing scans); the sub-grid arrays may, e.g., correspond to placement grids. As a result of rasterization the pixel data of the raster graphics array PIX (or of each sub-grid array) will be in the formal of, for instance, floating point numbers, representing nominal dose values for the respective pixels. Typically, the representation of the input pattern data in the pixel domain increases the storage requirements by an order of magnitude. For the processing of these data, graphics processing units (GPUs) are particularly suited whereas data communication overhead is practically negligible and calculational operations on the data can be done in parallel.

In a variation or complement of this embodiment, corrections for adverse effects to the writing conditions that affect all columns in the same way can be applied already in the pixel domain to the data of the array PIX, rather than (or supplemental to) the operations on the element of SPLITGEOM. The same considerations apply as discussed above with input data for the correction process DOSEMOD and DISLOCMOD; where the output PIX is a raster graphics array or a collection of sub-grid arrays.

In the next step 94, the pixel data of the raster graphics array PIX may be corrected for column-specific adverse effects to the writing conditions. This correction step will produce corrected pixel data CORRPIX, as individually corrected copies of the input pixel data. For instance, this correction step may include distortions of the beam array field that cannot be corrected via optical beam deflection means, spatial variations of beam blur within the beam array field, and/or spatial variations of the current density of the charged-particle beam, as described in U.S. Pat. No. 9,568,907 B2, U.S. Pat. No. 9,520,268 B2, and U.S. Pat. No. 10,325,757 B2 of the applicant, respectively, which disclose a number of correction techniques and whose teachings are herewith included by reference.

One example for corrections in the pixel domain is described in U.S. Pat. No. 9,520,268 B2: A set of predetermined column specific blur homogenizing kernels COLMOD may be applied to the pixel data of a beam array field. This type of correction is carried out by convoluting the pixel data with the kernels. Since the convolution kernel typically acts on the range of the blur, which is a few tens on nanometers, it is possible to parallelize the calculation processes in an effective way where the pixel data of the beam array are distributed over different CPUs and/or GPUs.

In a variation or complement of this embodiment, corrections for column-specific adverse effects to the writing conditions may also be applied already in the vector domain. In particular, spatial dislocations are suited for such a correction, as described in U.S. Pat. No. 9,568,907 B2 of the applicant.

Subsequently, a dithering process of step 95 converts the dose value data of the pixel data CORRPIX into gray value data DITHPIX, based on a predetermined gray value scale. This is a position-dependent rounding process that ensures that rounding errors are averaged over nearby pixels which, combined with oversampling, allows for a much finer dose variation than with the discrete set of dose values available for a single aperture; it can be realized by means of known algorithms for the conversion of visual image data into pixel graphics. It is possible to apply additional corrections at this stage, provided they can be applied in the pixel domain, immediately before or after dithering depending on the actual correction (e.g. defective apertures correction as detailed in U.S. Pat. No. 9,269,543 B2). The resulting data DITHPIX are, for instance, integer data represented on a raster array.

In step %, a pixel packaging may be performed. The data DITHPIX obtained from stage 95 is distributed into a sequence of pixel data corresponding to the sequence of aperture images generated on the target, sorted according to the placement grid sequence. This serves to reorder the pixel data into a suitable form that can be received by the PD system and is compatible with the writing method, and the resulting pixel package data PACKPIX are stored to a dedicated memory device (storage device 11M of FIG. 7) which can support the access speeds and transmission rates required by the writing process. For instance, with the writing method explained above referring to FIGS. 4-6, two pixels next to each other within the same exposure cell may be exposed with a large number of other pixel exposures between them, e.g. up to $(No)^2-2$ pixel exposures in between. Thus, in this embodiment the pixel package data forms the intermediate data that will be kept in memory where it may be accessed multiple times for repeated exposures of the same pattern.

Taking into account the computational effort of the data preprocessing unit for each column it will be expedient to store the intermediate data as long as possible, at most until the required number of wafer or masks are exposed. However, adverse effects resulting in non-ideal writing conditions change with time and corrections applied throughout the data preprocessing must be readjusted. To take account of this possibility, it may be advantageous to monitor the characteristics of the tool and each column by in-situ and ex-situ processes that can provide feedback when writing conditions have changed sufficiently to rectify a readjustment of the corrections. In-situ processes may, for instance, involve measurement of the charged particle current by means of a Faraday cup. Ex-situ processes on the other hand, typically involve inspection of reference patterns written to a target substrate by an independent measurement device, for instance a scanning electron microscope. The tool monitor data resulting from processes is then used in model-based and/or measurement-based analyses to determine the extent of corrections, which are then applied as discussed for steps 92, 93, 94, and 95. In case the corrections must be readjusted, the entire preprocessing has to be started from scratch, using the input pattern data in vector format. For instance, this case of the data processing pipeline can be advantageous for multicolumn tools where each sub-column requires frequent readjustment of corrections for the sub-column's illumination system, for instance due to fluctuations in one or more of the individual sources. Such readjustments can be applied in the data preprocessing unit which effectively requires the preprocessing to start from scratch. Ideally, this preprocessing can be done in parallel to the current streaming process so that it can replace the intermediate data for the next streaming process only after it has completed. This ensures that the lithography apparatus can operate without interruption while at the same time maintain high quality.

Finally, the data streaming unit 182 reads the pixel package data PACKPIX from the memory and streams them to buffer memory SBUF associated with the PD system(s) of the respective writer tool—symbolized as step 97 in FIG. 8.

Vector Data Based Intermediate Data

Figure 9:
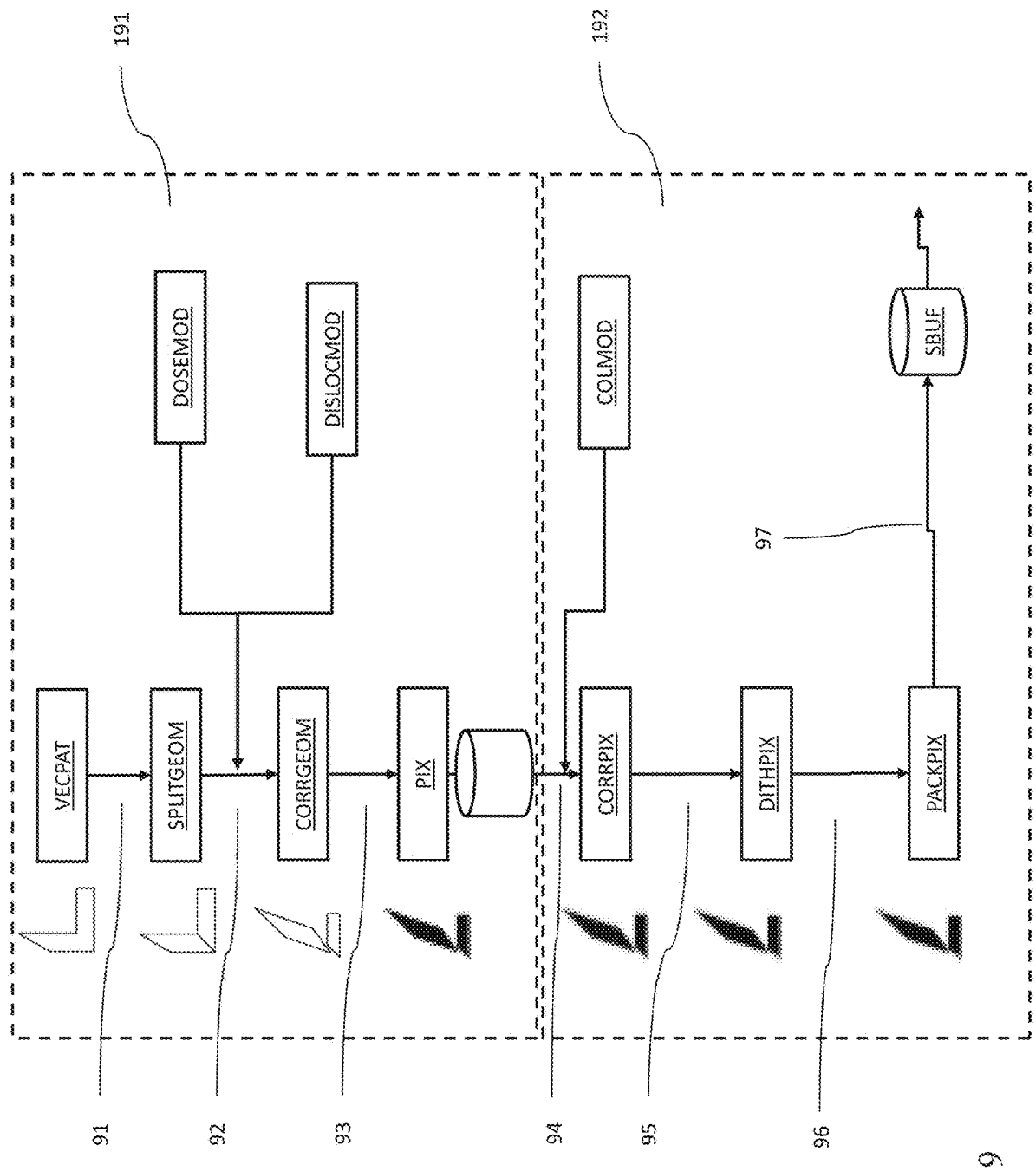
FIG. 9 is a flowchart of the pattern data processing pipeline according to another embodiment of the pattern data processing flow.

FIG. 9 shows a flowchart of the pattern data processing pipeline in the data center 191 and data path 192 of another embodiment of the pattern data processing flow. In this example, the data preprocessing unit 191 converts the pattern input data in vector format in step 91, 92 and 93, as in the process of FIG. 8, into a generic raster graphics representation PIX that contains no column specific corrections. The result, the pixel data PIX, forms the intermediate data that is stored on a storage medium so as to ensure access by the data streaming units with high transmission rates. In this case, the data streaming unit 192 may contain additional subunits for applying column specific corrections, such as kernels COLMOD, of step 94 to the pixel data during the streaming process. Also in this variant, the workload of such corrections can be run in parallel, distributed over multiple CPUs and/or GPUs and/or FPGAs, so that this processing can be done in real-time, i.e. without noticeably reducing the data streaming rate. The subsequent steps 95 and % may also be carried out analogously in the data streaming unit, and steps 97 and onwards are carried out as in the process of FIG. 8. This alternative partition of the data center and the data path allows to frequently adjust the correction subunits if the writing conditions require so. For instance, this case of the data processing pipeline is particularly advantageous for multicolumn tools where each sub-column requires frequent readjustment of corrections for the sub-column's illumination system, for instance due to fluctuations in one or more of the individual sources. Such readjustments can be determined by in-situ measurements and applied immediately in the correction unit of step 94 without interruption or additional burden on the operation of the lithography apparatus.

Figure 10:
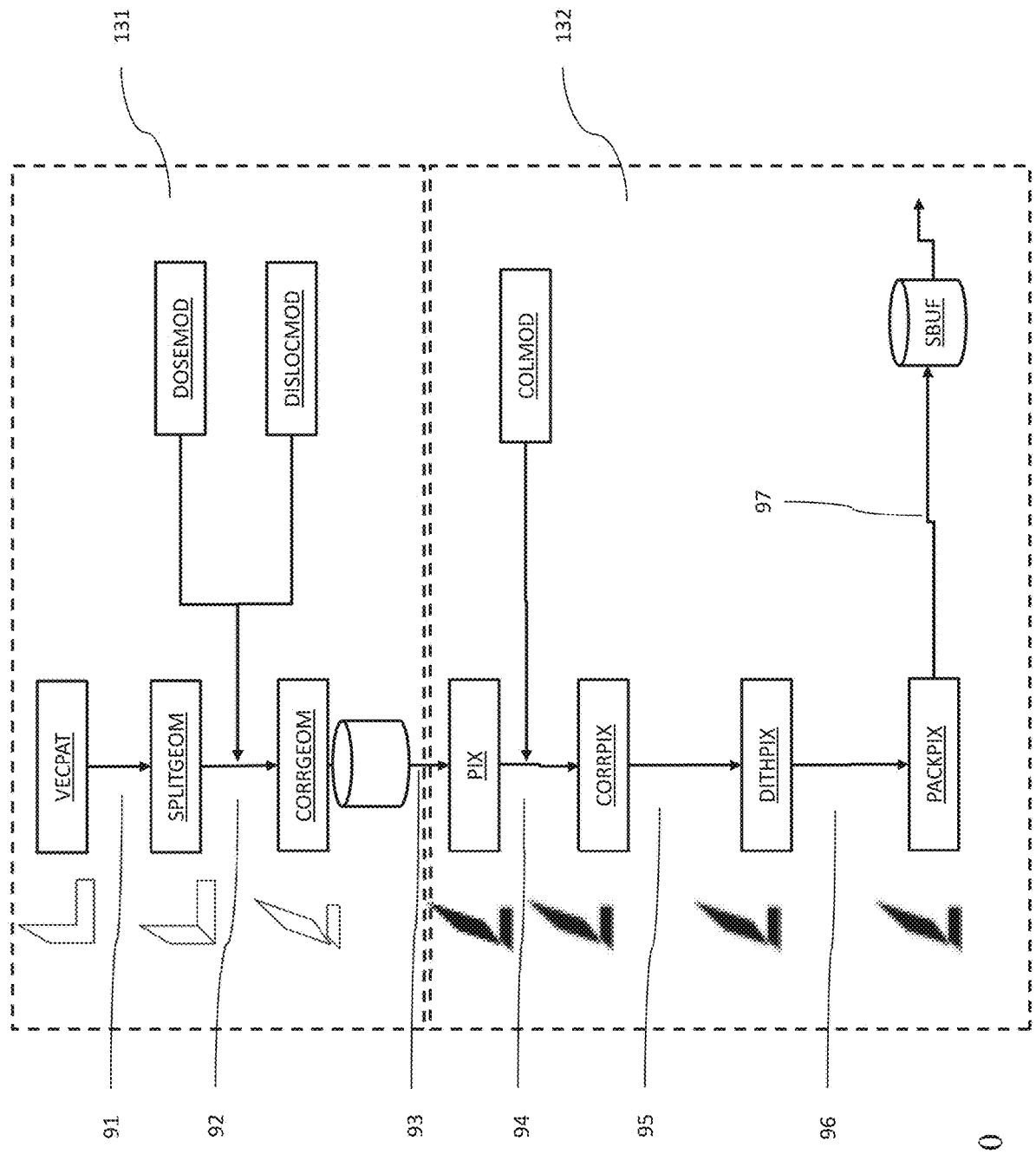
FIG. 10 is a flowchart of the pattern data processing pipeline according to yet another embodiment of the pattern data processing flow.

FIG. 10 shows a flowchart of the pattern data processing pipeline in the data center 131 and data path 132 of yet another embodiment of the pattern data processing flow. In this example, the data processing unit 131 converts the pattern input data in two steps 91 and 92 only, which are the same as described above, resulting in data CORRGEOM of a plurality of corrected geometric elements. In this case, the data CORRGEOM forms the intermediate data that is stored on a permanent memory 11M, and which is then accessed by the data streaming unit 132 on demand during the writing process. This typically reduces the storage requirements of intermediate data by a factor of ten as compared to the rasterized pixel data PIX. On the other hand, in this setup, the data streaming unit will perform the rasterization process 93, and the following steps described before.

Data Streaming

As mentioned above, the data streaming unit 182, 192, 132 streams the pixel package data to buffer memory SBUF associated with the PD system. With regard to the specifics of the writing process, it is advisable to obey two requirements simultaneously:

(1) The scanning stripe exposure strategy entails that the target moves relative to the column including the PD system that forms the beamlet array field.

(2) The pixel package data streamed to the PD system must correspond to the pattern to be exposed on the target when the beamlet array field covers the respective area of the pattern to be exposed.

Figure 11:
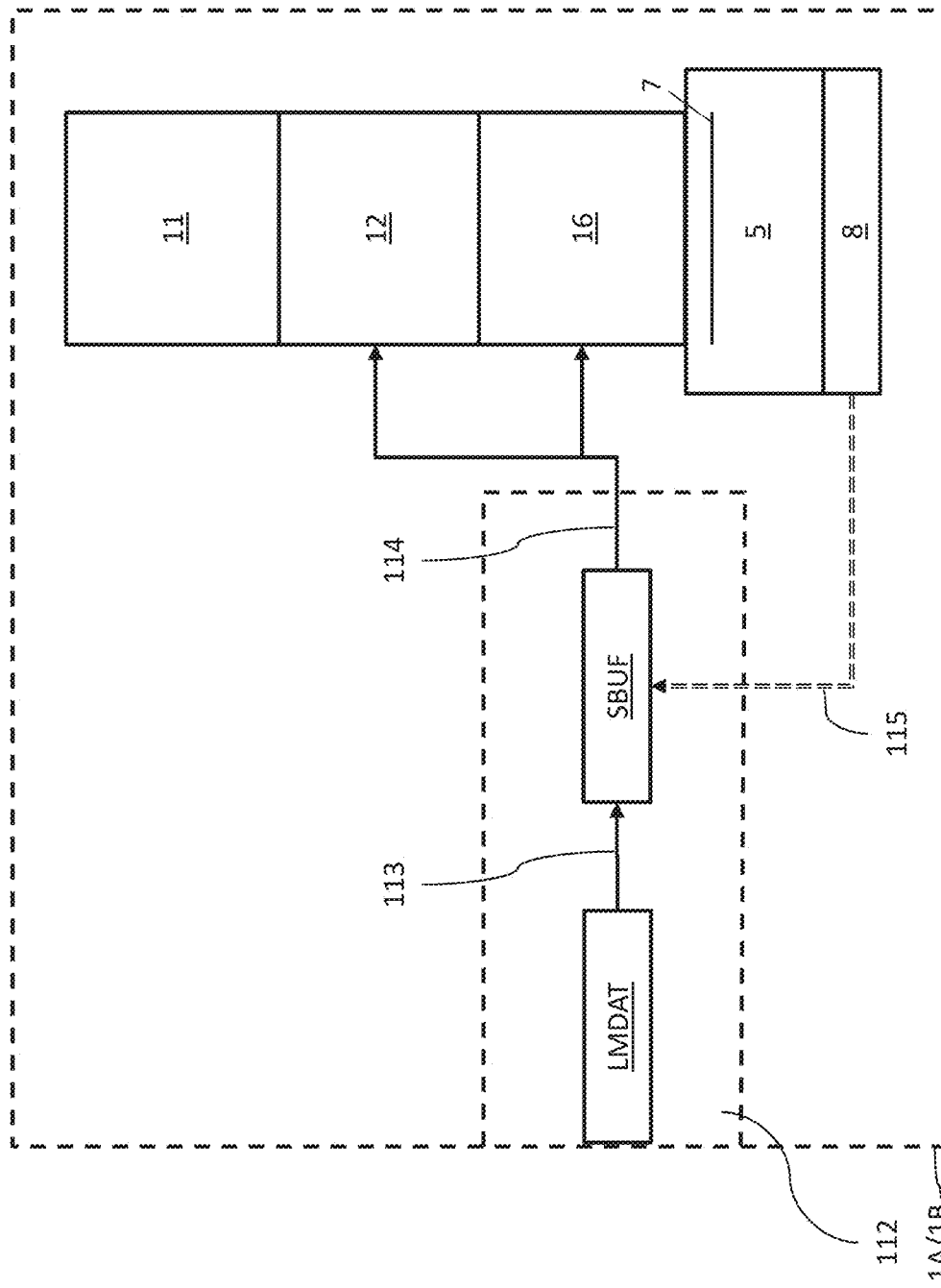
FIG. 11 illustrates a two-layered streaming architecture of the data streaming process to the writing tools.

These two requirements are tight, but can be satisfied, e.g. by using a two-stage streaming architecture for the streaming process which is illustrated in FIG. 11. This two-stage streaming process is carried out in a data streaming unit 112, corresponding to any one of units 102, 182, 192, 132 of FIGS. 7-10, of the relevant writer tool 1A/1B.

In a first stage, the data streaming unit 112 obtains the intermediate data from the storage 11M and may store them in a local intermediate storage LMDAT. From there, the data streaming unit 112 transmits the data to a buffering subunit SBUF, possibly after applying processing 113 on the intermediate data. The intermediate data may, with regard to FIGS. 8-10, correspond to the data PACKPIX or precursor data thereof, such as PIX (FIG. 9) or CORRGEOM (FIG. 10). In the case of precursor data, such data will require additional processing 113 which can be carried out as part of the streaming process within the streaming unit 112, to obtain data in PACKPIX format (or equivalent format); for instance in the case of PIX or CORRGEM, the processing 113 will comprise the processing steps 94-96 or 93-96 of FIGS. 9 and 10, respectively. In the case that the intermediate data is the PACKPIX data (FIG. 8), they are suitable for the PD system already, and processing 113 is skipped. The data transmission between the storage device 11M and the data streaming unit 112 can be realized using state-of-the-art optical communication links. The resulting data (in a data format such as PACKPIX), which corresponds to the raster graphics array or a collection of sub-grid arrays, is then written into the buffering subunit SBUF.

The data for a stripe scan usually corresponds to one or more sub-grid arrays. As soon as the entire data for the next stripe scan is available in the buffering subunit SBUF, a second stage of the streaming, including the writing process for that stripe, i.e. pixel sub-grid array, can be started or continued: The respective buffered data 114 are read out from the buffering subunit SBUF and supplied to the PD system 12 of the writer tool at a constant rate, while the target can be moved relative to the PD device at a corresponding constant speed.

It is worthwhile to mention that the streaming data 114 are not only provided to the PD device 12, but also the beam deflection device of the projection optics 16, since it has a pivotal role during the writing process: It serves to keep the beams locked to their placement grid positions during an exposure cycle and to shift the beams to their next positions on the placement grid. During the scanning stripe process the column 1A/1B is being moved relative to the exposure target 7 by means of positioning unit (X-Y stage) 5, while the target positioning is monitored by a laser metrology unit 8. The latter feeds back position information 115 to the buffering subunit. Also for the position information 115, data transmission can be realized by state-of-the-art optical communication links.

This feedback cycle based on the position information 115 in combination with the buffering subunit SBUF forms a highly advantageous feature of the second stage of the streaming architecture. It ensures that the pattern data streamed to the PD device 12 is in synchronization with the position of the target 7, and the pattern thus exposed ends up faithfully at its design position.

What is claimed is:

1. Method for performing a writing process of a desired pattern onto a target using at least one charged-particle multi-beam apparatus, wherein said desired pattern is provided as input pattern data coded in a vector format, wherein said apparatus includes an illumination system, a pattern definition system, and a projection optics, wherein the illumination system is configured to produce a charged-particle beam and direct it onto the pattern definition system, the pattern definition system is configured to form the charged-particle beam into a multitude of sub-beams representing the pattern, and the projection optics system serves to project the multitude of sub-beams onto the target, the method comprising at least the following steps which are performed independently of the writing process at a data preprocessing system:
receiving the input pattern data,
preprocessing the input pattern data using writing parameter data provided to the data preprocessing system so as to obtain intermediate pattern data,
writing the intermediate pattern data to a data storage,
the method further comprising at least the following steps carried out during initialization and/or performing a writing process using said at least one apparatus, by means of at least one writing control system associated therewith:
reading the intermediate pattern data from the data storage,
converting the intermediate pattern data to obtain pattern streaming data,
streaming the pattern streaming data to at least one pattern definition system of said at least one apparatus, each pattern definition system forming a respective charged-particle beam of said at least one apparatus into said multitude of sub-beams during the writing process in accordance with said pattern streaming data;
wherein the charged-particle multi-beam apparatus comprises two or more multi-beam columns arranged in parallel, and
wherein the step of reading the intermediate pattern data from the data storage and subsequent steps are carried out in said multi-beam columns at least partly in parallel on one or more targets.

2. The method of claim 1, wherein preprocessing the input data at the data preprocessing system includes at least one of the following:
dividing the input pattern data coded in a vector format into a plurality of geometric basic elements;
applying a geometry and/or dose correction to the input pattern data or geometric basic elements so as to compensate for deviations from ideal writing conditions determined in advance to the writing process, wherein the geometry and/or dose correction is carried out using correction data which are supplied as external data based on previous writing processes and/or test processes and/or model-based simulations.

3. The method of claim 2, wherein preprocessing the input data at the data preprocessing system generates preprocessed intermediate pattern data in vector format, which are written as intermediate pattern data to the data storage,
and the initialization and/or performing a writing process by means of said at least one writing control system includes, after reading the intermediate pattern data from the data storage,
converting the input pattern data so as to obtain raster graphics data which represent at least a part of the desired pattern in a raster graphics format.

4. The method of claim 1, wherein the intermediate pattern data are raster graphics data with respect to a raster to be used during the writing process, and preprocessing the input data at the data preprocessing system includes
converting the input pattern data so as to obtain raster graphics data which represent at least a part of the desired pattern in a raster graphics format.

5. The method of claim 3, wherein the steps carried out during a writing process by means of the at least one writing control system further include at least one of the following:
applying a geometry and/or dose correction to the raster graphics data so as to compensate for deviations from ideal writing conditions determined during the writing process;
dithering pixel data including converting the data so as to conform with a predetermined gray value scale;
packaging pixel data into a data format which allows the pixel data to be streamed at a transmission speed required by the writing process.

6. The method of claim 4, wherein preprocessing the input data at the data preprocessing system includes, after converting to raster graphics data, at least one of the following:
applying a geometry and/or dose correction to the raster graphics data so as to compensate for deviations from ideal writing conditions determined during the writing process;
dithering pixel data including converting the data so as to conform with a predetermined gray value scale;
packaging pixel data into a data format which allows the pixel data to be streamed at a transmission speed required by the writing process;
before writing the data thus processed as intermediate pattern data to the data storage.

7. The method of claim 1, wherein said multi-beam columns arranged in parallel comprise at least two distinct illumination systems.

8. The method of claim 1, wherein the step of reading the intermediate pattern data from the data storage and subsequent steps are carried out by two or more separate writing processes taking place in different charged-particle multi-beam apparatuses, preferably simultaneously.

9. A charged-particle multi-beam apparatus, configured to perform a writing process for writing a desired pattern onto a target, comprising an illumination system, a pattern definition system, and a projection optics, wherein the illumination system is configured to produce a charged-particle beam and direct it onto the pattern definition system, the pattern definition system is configured to form the charged-particle beam into a multitude of sub-beams representing the pattern, and the projection optics system serves to project the multitude of sub-beams onto the target, said apparatus being further provided with a writing control system configured to:
access a data storage to retrieve intermediate pattern data which contain preprocessed pattern data of the desired pattern, convert the intermediate pattern data to obtain pattern streaming data, stream the pattern streaming data to the pattern definition system, directing the pattern definition system to form the charged-particle beam into said multitude of sub-beams during the writing process in accordance with said pattern streaming data wherein the charged-particle multi-beam apparatus comprises two or more multi-beam columns arranged in parallel, which are configured to carry out the step of accessing the data storage to retrieve intermediate pattern data and subsequent steps at least partly in parallel on one or more targets.

10. The apparatus of claim 9, wherein the writing control system is configured to retrieve and process the intermediate pattern data during initialization and/or performing a writing process performed in said apparatus.

11. The apparatus of claim 9, wherein the writing control system is further configured to perform at least one of the following steps after retrieving the intermediate pattern data:

converting the pattern data so as to obtain raster graphics data which represent at least a part of the desired pattern in a raster graphics format;

applying a geometry and/or dose correction to the raster graphics data so as to compensate for deviations from ideal writing conditions determined during the writing process;

dithering pixel data including converting the data so as to conform with a predetermined gray value scale;

packaging pixel data into a data format which allows the pixel data to be streamed at a transmission speed required by the writing process.

12. The apparatus of claim 9, wherein said multi-beam columns arranged in parallel comprise at least two distinct illumination systems.

13. The method of claim 4, wherein the steps carried out during a writing process by means of the at least one writing control system further include at least one of the following:

applying a geometry and/or dose correction to the raster graphics data so as to compensate for deviations from ideal writing conditions determined during the writing process;

dithering pixel data including converting the data so as to conform with a predetermined gray value scale;

packaging pixel data into a data format which allows the pixel data to be streamed at a transmission speed required by the writing process.

14. The method of claim 1, wherein each of said multi-beam columns arranged in parallel comprises a respective illumination system.

15. The apparatus of claim 9, wherein each of said multi-beam columns arranged in parallel comprises a respective illumination system.

* * * * *